(12) United States Patent
Tamura et al.

(10) Patent No.: US 9,567,435 B2
(45) Date of Patent: Feb. 14, 2017

(54) THERMOSETTING RESIN COMPOSITION

(71) Applicant: NISSAN CHEMICAL INDUSTRIES, LTD., Tokyo (JP)

(72) Inventors: Mamoru Tamura, Toyama (JP); Takuya Ohashi, Toyama (JP); Tomoyuki Enomoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 4 days.

(21) Appl. No.: 14/778,164

(22) PCT Filed: Mar. 18, 2014

(86) PCT No.: PCT/JP2014/057358
§ 371 (c)(1),
(2) Date: Sep. 18, 2015

(87) PCT Pub. No.: WO2014/156843
PCT Pub. Date: Oct. 2, 2014

(65) Prior Publication Data
US 2016/0272764 A1 Sep. 22, 2016

(30) Foreign Application Priority Data

Mar. 25, 2013 (JP) ................. 2013-062168

(51) Int. Cl.
| | | |
|---|---|---|
| C08G 73/06 | (2006.01) |
| C09J 179/04 | (2006.01) |
| C08G 59/40 | (2006.01) |
| C09J 161/34 | (2006.01) |
| C09J 163/00 | (2006.01) |
| C08L 61/34 | (2006.01) |
| C08L 63/00 | (2006.01) |
| H01L 23/00 | (2006.01) |
| C08K 5/544 | (2006.01) |
| C08K 9/06 | (2006.01) |
| C08L 79/04 | (2006.01) |
| H01L 23/29 | (2006.01) |

(Continued)

(52) U.S. Cl.
CPC .............. *C08G 73/06* (2013.01); *C08G 59/40* (2013.01); *C08K 5/544* (2013.01); *C08K 9/06* (2013.01); *C08L 61/34* (2013.01); *C08L 63/00* (2013.01); *C08L 79/04* (2013.01); *C09J 161/34* (2013.01); *C09J 163/00* (2013.01); *C09J 179/04* (2013.01); *H01L 23/295* (2013.01); *H01L 23/3142* (2013.01); *H01L 24/26* (2013.01); *H01L 24/29* (2013.01); *H01L 21/563* (2013.01); *H01L 2224/2919* (2013.01); *H01L 2924/0665* (2013.01); *H01L 2924/186* (2013.01)

(58) Field of Classification Search
None
See application file for complete search history.

(56) References Cited

U.S. PATENT DOCUMENTS

| | | | | |
|---|---|---|---|---|
| 8,349,992 B2* | 1/2013 | Eguchi | ................... | C08G 73/06 528/289 |
| 2012/0010202 A1* | 1/2012 | Taden | .................. | C07D 265/16 514/230.5 |
| 2012/0172569 A1* | 7/2012 | Katagiri | ................... | C08L 79/04 528/127 |

FOREIGN PATENT DOCUMENTS

| | | |
|---|---|---|
| JP | 2008-201998 A | 9/2008 |
| JP | 2008-291070 A | 12/2008 |
| JP | 2009-242669 A | 10/2009 |

(Continued)

OTHER PUBLICATIONS

Jun. 24, 2014 Written Opinion issued in International Patent Application No. PCT/JP2014/057358.

(Continued)

*Primary Examiner* — Vickey Nerangis
(74) *Attorney, Agent, or Firm* — Oliff PLC

(57) ABSTRACT

There is provided novel thermosetting resin composition. A thermosetting resin composition comprising a polymer having at least one structural unit of the following Formula (1):

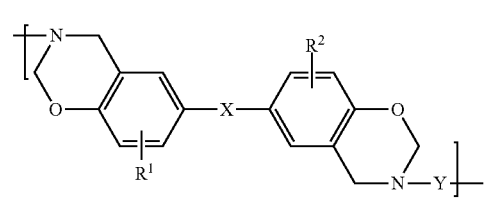

(1)

{wherein each of $R^1$ and $R^2$ is independently a hydrogen atom or a $C_{1-4}$ alkyl group, X is a single bond or a divalent organic group, and Y is an arylene group of the following Formula (2):

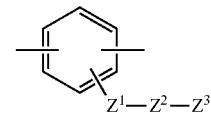

(2)

(wherein $Z^1$ is a carbonyl group or a —CONH— group, $Z^2$ is a $C_{1-5}$ alkylene group or a 5- or 6-membered divalent saturated heterocyclic group containing at least one nitrogen atom, and $Z^3$ is a 5- or 6-membered aromatic heterocyclic group containing two nitrogen atoms in which at least one of hydrogen atoms may be substituted by a $C_{1-5}$ alkyl group)}.

15 Claims, No Drawings

(51) Int. Cl.
*H01L 23/31* (2006.01)
*H01L 21/56* (2006.01)

(56) References Cited

FOREIGN PATENT DOCUMENTS

| | | |
|---|---|---|
| JP | 2009-256650 A | 11/2009 |
| JP | 4887850 B2 | 2/2012 |
| JP | 4931079 B2 | 5/2012 |
| WO | 2007129640 A1 | 11/2007 |
| WO | 2009008468 A1 | 1/2009 |
| WO | 2010032729 A1 | 3/2010 |
| WO | 2011040459 A1 | 4/2011 |

OTHER PUBLICATIONS

Jun. 24, 2014 Search Report issued in International Patent Application No. PCT/JP2014/057358.

* cited by examiner

THERMOSETTING RESIN COMPOSITION

TECHNICAL FIELD

The present invention relates to a thermosetting resin composition containing a novel polymer, a molded body and a cured product that are obtained from the thermosetting resin composition, and an adhesive composition that allows substances to be laminated to adhere or an underfill composition used for flip chip bonding in a process of producing a semiconductor device typified by an IC chip.

BACKGROUND ART

In recent years, higher integration of semiconductor devices has been required with enhancement in the performance and miniaturization of electronic appliances such as cell phones and IC cards. As a procedure for higher integration, the finer pattern of semiconductor elements themselves, and a stack structure in which semiconductor elements are stacked longitudinally have been investigated. In production of the stack structure, an adhesive is used for junction between the semiconductor elements.

In production of the stack structure, flip chip bonding has been known as a method of mounting an IC chip on a substrate. This is a method in which a plurality of bumps (projected terminals) are disposed and electrically connected to electrode terminals on the substrate. An underfill agent is used to seal a gap between the substrate and the IC chip and protect the IC chip against moisture and an exterior stress. As the underfill agent, a composition containing an epoxy resin has been used (e.g., Patent Documents 1 and 2). Conventionally, a method in which an underfill agent is injected after connection of a substrate and an IC chip to bumps (post-applied underfilling), and then thermally cured has been often used. However, miniaturization of bumps, a decrease in pitches, and an increase in the size of IC chips make the post-applying of an underfill agent difficult. As a countermeasure, a pre-applied underfilling will be mainly employed in the future, in which an underfill agent is previously formed on a wafer with bumps, the wafer is diced, and the diced IC chip is subjected to flip chip bonding.

In such flip chip bonding, bumps are connected readily after bonding of underfill. Therefore, a conventional adhesive described in Patent Document 3 makes it difficult to prevent generation of voids. This is because the adhesive is momentarily exposed to high temperature in an uncured state.

A wafer-on-wafer (WOW) structure in another method of producing a stack structure described in Patent Document 4 makes it difficult to employ a low molecular weight component that causes voids and a component that has low heat resistance and is decomposed. This is because the WOW structure requires adhesion between wafers without generation of voids.

A thermosetting resin composition containing a compound having an aromatic benzoxazine ring as a main chain has been known (e.g., Patent Documents 5 and 6). A benzoxazine resin having excellent heat resistance and electrical characteristics has been also known. The thermosetting resin composition containing a compound having an aromatic benzoxazine ring as a main chain described in Patent Documents 5 and 6 has low crosslink density and high linear expansion coefficient at a temperature equal to or higher than the glass transition point. Therefore, there is a concern of reduction in reliability caused by occurrence of cracks and peeling due to thermal history.

As a known technique, a technique of mixing an epoxy resin in a benzoxazine resin to improve the crosslink density has been known. However, a cross-linking reaction of the mixed resin is slow, and sufficient crosslink density is not obtained. As a countermeasure, a technique of adding an epoxy resin curing agent, which is typified by an imidazole-based compound, has been widely known. However, since the epoxy resin curing agent has low heat resistance, there is a concern of reduction in reliability caused by generation of voids.

PRIOR ART DOCUMENTS

Patent Documents

Patent Document 1: Japanese Patent No. 4887850 (JP 4887850 B2)
Patent Document 2: Japanese Patent No. 4931079 (JP 4931079 B2)
Patent Document 3: Japanese Patent Application Publication No. 2008-201998 (JP 2008-201998 A)
Patent Document 4: International Publication No. 2010/032729 (WO 2010/032729)
Patent Document 5: International Publication No. 2007/129640 (WO 2007/129640)
Patent Document 6: International Publication No. 2009/008468 (WO 2009/008468)

SUMMARY OF THE INVENTION

Problem to be Solved by the Invention

It is an object of the present invention to provide a thermosetting resin composition which has high heat resistance and excellent electrical characteristics and promotes curing of an epoxy resin, a molded body and a cured product that are obtained from the thermosetting resin composition, and a thermosetting adhesive composition or an underfill composition.

Means for Solving the Problems

The present invention provides a thermosetting resin composition comprising a polymer having at least one structural unit of the following Formula (1):

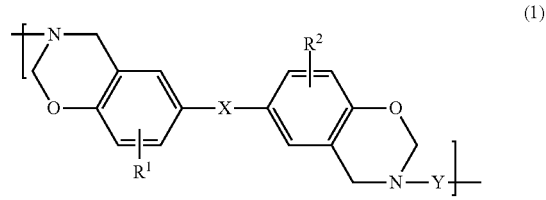

{wherein each of $R^1$ and $R^2$ is independently a hydrogen atom or a $C_{1-4}$ alkyl group, X is a single bond or a divalent organic group, and Y is an arylene group of the following Formula (2):

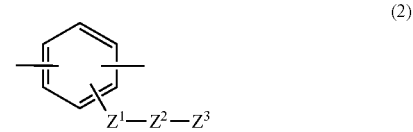

(wherein $Z^1$ is a carbonyl group or a —CONH— group, $Z^2$ is a $C_{1-5}$ alkylene group or a 5- or 6-membered divalent saturated heterocyclic group containing at least one nitrogen atom, and $Z^3$ is a 5- or 6-membered aromatic heterocyclic group containing two nitrogen atoms in which at least one of hydrogen atoms may be substituted by a $C_{1-5}$ alkyl group)}.

When in Formula (2), $Z^2$ is a 5- or 6-membered divalent saturated heterocyclic group containing at least one nitrogen atom, examples of the saturated heterocyclic group include a piperazine ring, an imidazolidine ring, and a pyrazolidine ring. Examples of an aromatic heterocyclic ring in a 5- or 6-membered aromatic heterocyclic group containing two nitrogen atoms of $Z^3$ in Formula (2) include an imidazole ring, a pyrimidine ring, a pyrazine ring, and a pyrazol ring.

For example, in Formula (2), $Z^3$ is an imidazolyl group, $Z^2$ is a $C_{1-5}$ alkylene group, and $Z^1$ is a —CONH— group.

In Formula (1), X is, for example, a divalent organic group containing a $C_{1-6}$ alkylene group in which at least one of hydrogen atoms may be substituted by a halogen atom, a cyclic alkylene group, an arylene group in which at least one of hydrogen atoms may be substituted by a halogen atom, a sulfonyl group, a carbonyl group, a —O— group, or a —COO— group.

In Formula (1), X is, for example, a divalent organic group of the following Formula (3):

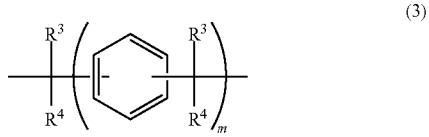

(3)

(wherein each of $R^3$ and $R^4$ is independently a hydrogen atom or a methyl group in which at least one of hydrogen atoms may be substituted by a halogen atom, and m is 0 or 1).

For example, the divalent organic group of Formula (3) is the following Formula (3-a) or (3-b).

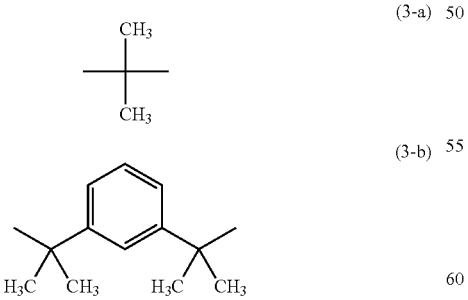

(3-a)

(3-b)

The polymer contained in the thermosetting resin composition of the present invention may further have a structural unit of the following Formula (4) in addition to the structural unit of Formula (1):

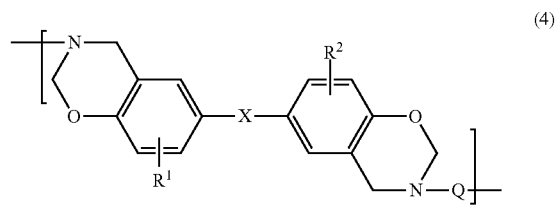

(4)

{wherein each of $R^1$ and $R^2$ is independently a hydrogen atom or a $C_{1-4}$ alkyl group, X is a single bond or a divalent organic group, and Q is a divalent organic group of the following Formula (5) or (6):

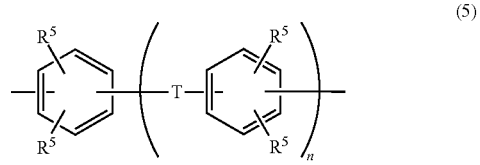

(5)

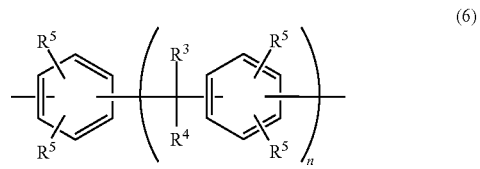

(6)

(wherein T is a single bond, a sulfonyl group, or a —O— group, each of $R^3$ and $R^4$ is independently a hydrogen atom or a methyl group in which at least one of hydrogen atoms may be substituted by a halogen atom, four $R^5$ are each independently a hydrogen atom, a methyl group, an ethyl group, or a methoxy group, and n is 0 or 1)}.

For example, the divalent organic group of Formula (5) or (6) is the following Formula (5-a), (6-a), (6-b), or (6-c):

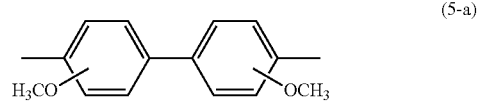

(5-a)

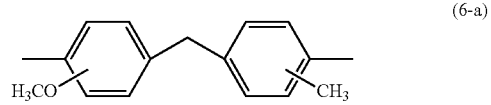

(6-a)

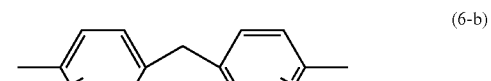

(6-b)

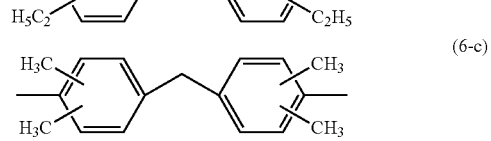

(6-c)

For example, the polymer has a weight average molecular weight of 1,000 to 100,000.

The thermosetting resin composition of the present invention may further comprise an epoxy resin.

The thermosetting resin composition of the present invention may further comprise a silane coupling agent.

The thermosetting resin composition of the present invention may further comprising inorganic fillers having a particle diameter of 1 nm or more and 700 nm or less.

The thermosetting resin composition of the present invention may comprise a solvent.

For example, the thermosetting resin composition of the present invention is a thermosetting adhesive composition or an underfill composition.

Effects of the Invention

The thermosetting resin composition of the present invention may be cured at temperature as relatively low as 200° C. or lower, and promote a curing reaction of an epoxy resin. A film formed from the thermosetting resin composition of the present invention has good adhesion without generation of voids, is unlikely to be peeled after adhesion, and has excellent heat resistance and good electrical characteristics. When the thermosetting resin composition of the present invention is mixed in an epoxy resin, the crosslink density is improved. Therefore, the thermosetting resin composition of the present invention is useful for an epoxy curing accelerator, an adhesive, or an underfill agent.

MODES FOR CARRYING OUT THE INVENTION

When the thermosetting resin composition of the present invention contains a polymer having at least one structural unit of Formula (1) and an epoxy resin, a compound having at lest one epoxy group in the molecule can be used as the epoxy resin. Examples of the epoxy resin include 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidyl aniline), trimethylol ethane triglycidyl ether, triglycidyl-p-aminophenol, tetraglycidyl methaxylene diamine, tetraglycidyl diaminodiphenylmethane, tetraglycidyl-1,3-bis(aminomethyl)cyclohexane, bisphenol-A-diglycidyl ether, bisphenol-S-diglycidyl ether, pentaerythritol tetraglycidyl ether resorcinol diglycidyl ether, phthalic acid diglycidyl ester, neopentyl glycol diglycidyl ether, polypropylene glycol diglycidyl ether, tetrabromobisphenol-A-diglycidyl ether, bisphenol hexafluoroacetone diglycidyl ether, pentaerythritol diglycidyl ether, tris-(2,3-epoxypropyl)isocyanurate, monoallyl diglycidyl isocyanurate, diglycerol polyglycidyl ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethylol perfluorohexane diglycidyl ether, 4,4'-bis(2,3-epoxypropoxyperfluoroisopropyl)diphenyl ether, 2,2-bis(4-glycidyloxyphenyl)propane, 3',4'-epoxycyclohexylmethyl-3,4-epoxycyclohexane carboxylate, 3,4-epoxycyclohexyloxirane, 2-(3,4-epoxycyclohexyl)-3',4'-epoxy-1,3-dioxane-5-spirocyclohexane, 1,2-ethylenedioxybis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis(3,4-epoxycyclohexylmethyl) adipate, bis(2,3-epoxycyclopentyl) ether, ε-caprolactone-modified tetra(3,4-epoxycyclohexylmethyl)butane tetracarboxylate, ε-caprolactone-modified 3',4'-epoxycyclohexylmethyl-3,4-epoxycyclohexane carboxylate, 1,2-epoxy-4-vinylcyclohexane, 1,2-epoxy-4-(2-methyloxiranyl)-1-methylcyclohexane, 1,2-epoxy-4-(2-oxiranyl)cyclohexane adduct of 2,2-bis(hydroxymethyl)-1-butanol, epoxidized polybutadiene, 3,4-epoxycyclohexylmethyl methacrylate, polyglycidyl methacrylate, an epoxidized compound of styrene-butadiene block copolymer, and a polynuclear phenol glycidyl ether derivative resin. Among the examples, an epoxy resin having an epoxycyclohexyl group is preferred.

One of these epoxy resins may be used alone or two or more thereof may be used in combination. The epoxy resin may be used in an amount of 1% by mass to 80% by mass, 5% by mass to 60% by mass, or 10% by mass to 50% by mass relative to the polymer contained in the thermosetting resin composition of the present invention.

When the thermosetting resin composition of the present invention contains a solvent, the solvent is not particularly limited as long as it is an organic solvent usable in a process of producing a semiconductor device. As such an organic solvent, a ketone such as cyclohexanone, cyclopentanone, tetrahydrofuran, methyl isoamyl ketone, 2-butanone, and 2-heptanone; a polyhydric alcohol such as ethylene glycol, ethylene glycol monoacetate, diethylene glycol, diethylene glycol monoacetate, propylene glycol, propylene glycol monoacetate, dipropylene glycol, dipropylene glycol monoacetate, and monomethyl ether, monoethyl ether, monopropyl ether, monobutyl ether, and monophenyl ether thereof, and a derivative thereof; a cyclic ether such as dioxane; or an ester such as methyl lactate, ethyl lactate, methyl acetate, ethyl acetate, butyl acetate, methyl pyruvate, ethyl pyruvate, methyl methoxypropionate, and ethyl ethoxypropionate is preferably used. One of these organic solvents may be used alone or a mixture of two or more thereof may be used. When a component other than the organic solvent in the thermosetting resin composition of the present invention is a solid content, the ratio of the solid content is, for example, 1% by mass to 70% by mass.

The thermosetting resin composition of the present invention may further contain an additive such as an inorganic filler, a silane coupling agent, a surfactant, a rheology controlling agent, and a crosslinker, if necessary.

Examples of the inorganic filler include sols having a particle diameter of 1 nm or more and 700 nm or less of silica, aluminum nitride, boron nitride, zirconia, and alumina. Particles in the inorganic filler may be surface-treated with a silane coupling agent described below.

Examples of the silane coupling agent include vinyltrimethoxysilane, vinyltriethoxysilane, 3-methacryloxypropyltriethoxysilane, 3-methacryloxypropyltrimethoxysilane, 3-glycidylpropyltrimethoxysilane, 3-glycidylpropyltriethoxysilane, 2-(3,4-epoxycyclohexyl)propyltrimethoxysilane, 2-(3,4-epoxycyclohexyl)propyltriethoxysilane, 2-(3,4-epoxycyclohexyl)ethyltrimethoxysilane, 2-(3,4-epoxycyclohexyl)ethyltriethoxysilane, 2-(3,4-epoxycyclohexyl)methyltrimethoxysilane, 2-(3,4-epoxycyclohexyl)methyltriethoxysilane, 3-aminopropyltriethoxysilane, 3-aminopropyltrimethoxysilane, and 3-phenylaminopropyltrimethoxysilane.

Examples of the rheology controlling agent include: phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate, and glyceryl stearate.

Examples of the surfactant include: nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitane tristearate; fluorosurfactants including EFTOP (registered trademark) EF301, EF303, and EF352 (available from Mitsubishi Materials Electronic Chemicals Co., Ltd.), MEGAFAC® F171, F173, R30, R30N, R40, and R40-LM (available from DIC Corporation), Fluorad FC430 and FC431 (available from Sumitomo 3M, Ltd.), Asahi Guard (registered trademark) AG710, and Surflon® S-382, SC101, SC102, SC103, SC104, SC105, and SC106 (available from Asahi Glass Co., Ltd.); and organosiloxane polymer KP341 (available from Shin-Etsu Chemical Co., Ltd.). One of these surfactants may be added alone or two or more thereof may be added in combination.

The thermosetting resin composition of the present invention does not always contain the crosslinker, but if used, examples of the crosslinker include nitrogen-containing compounds which may be substituted by an alkoxymethyl group such as a methoxymethyl group, an ethoxymethyl group, a butoxymethyl group, and a hydroxymethyl group, or a hydroxymethyl group. Furthermore, a phenol group-containing compound, an allyl group-containing compound, an allyl group-containing polymer, an isocyanate group-containing compound, or an isocyanate group-containing polymer may be used as the crosslinker.

Examples of the nitrogen-containing compounds include nitrogen-containing compounds such as hexamethoxy methyl melamine, tetramethoxymethyl benzoguanamine, 1,3,4,6-tetrakis(butoxymethyl) glycoluril, 1,3,4,6-tetrakis (hydroxymethyl) glycoluril, 1,3-bis(hydroxymethyl)urea, 1,1,3,3-tetrakis(butoxymethyl)urea, 1,1,3,3-tetrakis (methoxymethyl)urea, 1,3-bis(hydroxymethyl)-4,5-dihydroxy-2-imidazolinone, and 1,3-bis(methoxymethyl)-4,5-dihydroxy-2-imidazolinone. Examples of the crosslinker include commercially available compounds including methoxymethyl-type melamine compounds available from Nihon Cytec Industries Inc. (trade name: CYMEL® 300, 301, 303, and 350), butoxymethyl-type melamine compounds (trade name: MYCOAT® 506 and 508), glycoluril compounds (trade name: CYMEL® 1170 and POWDERLINK® 1174), methylated urea resin (trade name: UFR65), butylated urea resin (trade name: UFR300, U-VAN10S60, U-VAN10R, and U-VAN11HV), and urea-formaldehyde-based resin available from DIC Corporation (highly condensed, trade name: BECKAMINE® J-300S, P-955, and N).

One of these crosslinkers may be used alone or two or more thereof may be used in combination. The crosslinker may be used in an amount of 1% by mass to 50% by mass, 8% by mass to 40% by mass, or 15% by mass to 30% by mass relative to the polymer contained in the thermosetting resin composition of the present invention.

The thermosetting resin composition of the present invention may contain a crosslinking catalyst in addition to the crosslinker. Use of the crosslinking catalyst promotes a reaction of the crosslinker. Examples of the crosslinking catalyst include p-toluenesulfonic acid, trifluoromethanesulfonic acid, methanesulfonic acid, pyridinium p-toluenesulfonate, salicylic acid, camphorsulfonic acid, 5-sulfosalicylic acid, citric acid, benzoic acid, hydroxybenzoic acid, 4-chlorobenzenesulfonic acid, 4-hydroxybenzenesulfonic acid, benzenedisulfonic acid, and 1-naphthalene sulfonic acid. One of these crosslinking catalysts may be used alone or two or more thereof may be used in combination. The crosslinking catalyst may be used in an amount of 0.01% by mass to 10% by mass, 0.05% by mass to 8% by mass, 0.1% by mass to 5% by mass, 0.3% by mass to 3% by mass, or 0.5% by mass to 1% by mass relative to the polymer contained in the thermosetting resin composition of the present invention.

The thermosetting resin composition of the present invention can be used as an adhesive composition or an underfill composition. When the thermosetting resin composition of the present invention is used as an adhesive composition or an underfill composition, a commonly used additive such as an additive having a miscibility, for example, an additional resin to improve the performance of an additive, a tackifier, a plasticizer, an adhesion aid, a stabilizer, a colorant, an antifoaming agent, and flux may be added as long as substantial characteristics in the present invention are not impaired.

As the additional resin (polymer) to improve the performance of an adhesive, an addition polymerization polymer or a condensation polymerization polymer such as polyester, polystyrene, polyimide, acrylic polymer, methacrylic polymer, polyvinylether, phenol novolac, naphthol novolac, polyether, polyamide, and polycarbonate can be used. A polymer having an aromatic ring such as a benzene ring, a naphthalene ring, an anthracene ring, a triazine ring, a quinoline ring, and a quinoxaline ring is preferably used. Examples of the polymer having a triazine ring include polyesters having a structural unit of the following Formula (7):

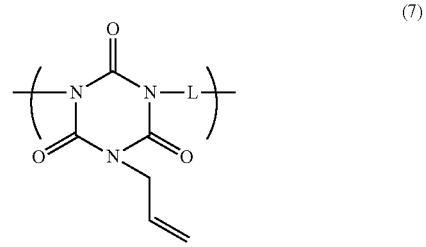

(wherein L is a divalent organic group).

Examples of the additional resin (polymer) include addition polymerization polymers containing an addition polymerizable monomer as the structural unit such as benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenyl maleimide, and condensation polymerization polymers such as phenol novolac and naphthol novolac. Furthermore, a polymer having no aromatic ring can be used as the additional resin (polymer). Examples of the polymer include addition polymerization polymers containing only an addition polymerizable monomer having no aromatic ring as the structural unit such as alkyl acrylate, alkyl methacrylate, vinyl ether, alkyl vinyl ether, acrylonitrile, maleimide, N-alkylmaleimide, and maleic anhydride. When an addition polymerization polymer is used as the additional resin (polymer), the polymer may be a homopolymer or a copolymer.

An adhesive composition or an underfill composition using the thermosetting resin composition of the present invention has a weight average molecular weight of 1,000 to 1,000,000, 3,000 to 300,000, 5,000 to 200,000, or 10,000 to 100,000. When the adhesive composition or the underfill composition of the present invention contains the additional resin (polymer), the content thereof in the solid content is, for example, 40% by mass or less, 20% by mass or less, or 1 to 19% by mass.

The tackifier is added to control the elastic modulus, viscosity, and the surface state. It is preferable that the kind of the tackifier be determined in consideration of viscosity. Examples of the tackifier include one or a combination of two or more selected from an aliphatic petroleum resin, an aromatic petroleum resin, an aliphatic/aromatic copolymer-based petroleum resin, an alicyclic hydrofined petroleum resin, an alkyl phenol resin, a xylene resin, a coumarone-indene resin, a terpene resin, a terpene-phenolic resin, an aromatic modified terpene resin, a hydrogenated terpene resin, a rosin-type resin, a hydrogenated rosin-type resin, a disproportionated rosin-type resin, a dimerized rosin-type resin, and an esterified rosin-type resin.

The tackifier may be contained in an amount of 100% by mass or less or 50% by mass or less relative to the polymer contained in the adhesive composition or the underfill composition of the present invention.

EXAMPLES

Hereinafter, the present invention will be described in more detail by Examples, and the present invention is not limited to these Examples.

In gel permeation chromatography (GPC) of polymer obtained in Synthesis Examples described below, the following device is used, and the measurement condition is as follows.
Device: integrated high-performance GPC system HLC-8220GPC manufactured by TOSOH CORPORATION
Column: KF-G and KF-804L
Column temperature: 40° C.
Solvent: tetrahydrofuran (THF)
Flow rate: 1.0 mL/min
Standard sample: polystyrene
Detector: RI Synthesis Example 1

4.68 g of 3-imidazolylpropyl-1,5-diaminobenzamide (another name: 1-imidazolylpropyl-3,5-diaminobenzamide), 41.21 g of 4,4'-diamino-3,3'-diethyldiphenylmethane (KAYAHARD A-A available from NIPPON KAYAKU Co., Ltd.), 69.29 g of bisphenol M (available from MITSUI FINE CHEMICALS, Inc.), 25.34 g of paraformaldehyde (available from Tokyo Chemical Industry Co., Ltd.), and 4.06 g of triethylamine were dissolved in 327.49 g of N-methyl-2-pyrrolidone. Purging with nitrogen was carried out, and a reaction was caused at 90° C. for 20 hours to obtain a solution containing a polymer. After that, the resultant solution was added dropwise to methanol, resulting in reprecipitation. The resultant precipitate was then collected by filtration with suction on a Buchner funnel, and washed with methanol twice. The resulting powder was dried for 12 hours with a reduced-pressure dryer to obtain a polymer. The obtained polymer was analyzed by GPC. The weight average molecular weight in terms of standard polystyrene was 3,800. The resulting polymer is presumed to have a structural unit of the following formula (4-a) and a structural unit of the following formula (1-a).

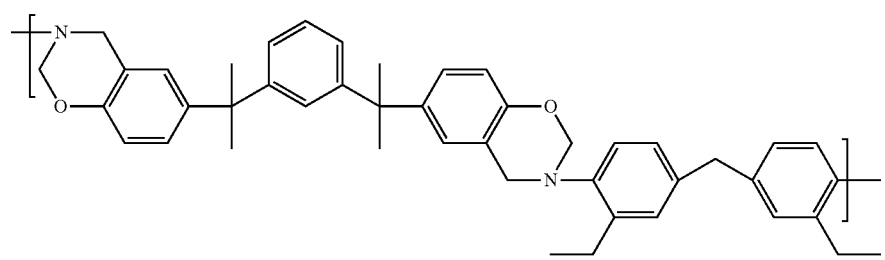

(4-a)

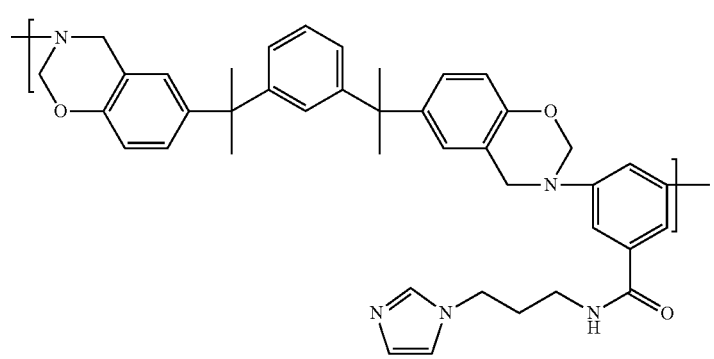

(1-a)

Synthesis Example 2

4.68 g of 3-imidazolylpropyl-1,5-diaminobenzamide (another name: 1-imidazolylpropyl-3,5-diaminobenzamide), 41.21 g of 4,4'-diamino-3,3',5,5'-tetramethyl diphenylmethane (KAYABOND 200S available from NIPPON KAYAKU Co., Ltd.), 69.29 g of bisphenol M (available from MITSUI FINE CHEMICALS, Inc.), 25.34 g of paraformaldehyde (available from Tokyo Chemical Industry Co., Ltd.), and 4.05 g of triethylamine were dissolved in 327.49 g of N-methyl-2-pyrrolidone. Purging with nitrogen was carried out, and a reaction was caused at 90° C. for 20 hours to obtain a solution containing a polymer. After that, the resultant solution was added dropwise to methanol, resulting in reprecipitation. The resultant precipitate was then collected by filtration with suction on a Buchner funnel, and washed with methanol twice. The resulting powder was dried for 12 hours with a reduced-pressure dryer to obtain a polymer. The obtained polymer was analyzed by GPC. The weight average molecular weight in terms of standard polystyrene was 5,000. The resulting polymer is presumed to have a structural unit of the following formula (4-b) and a structural unit of the following formula (1-a).

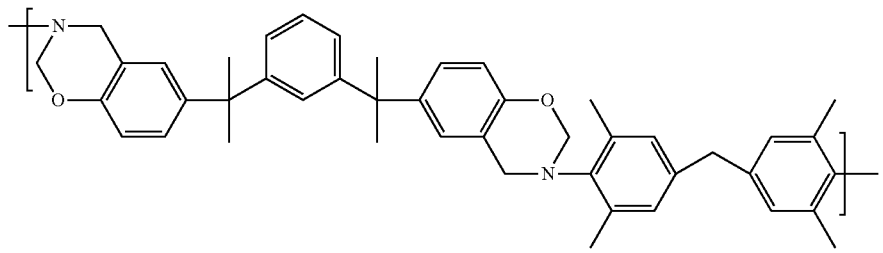

(4-b)

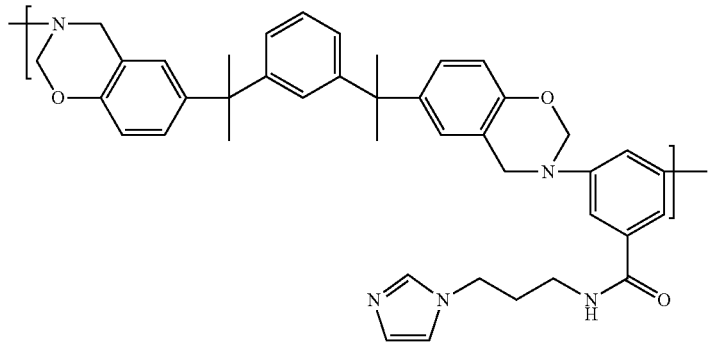

(1-a)

Synthesis Example 3

1.95 g of 1,3-phenylenediamine (available from Tokyo Chemical Industry Co., Ltd.), 41.20 g of 4,4'-diamino-3,3'-diethyldiphenylmethane (KAYAHARD A-A available from NIPPON KAYAKU Co., Ltd.), 69.30 g of bisphenol M (available from MITSUI FINE CHEMICALS, Inc.), 22.87 g of paraformaldehyde (available from Tokyo Chemical Industry Co., Ltd.), and 4.05 g of triethylamine were dissolved in 320.48 g of N-methyl-2-pyrrolidone. Purging with nitrogen was carried out, and a reaction was caused at 90° C. for 20 hours to obtain a solution containing a polymer. After that, the resultant solution was added dropwise to methanol, resulting in reprecipitation. The resultant precipitate was then collected by filtration with suction on a Buchner funnel, and washed with methanol twice. The resulting powder was dried for 12 hours with a reduced-pressure dryer to obtain a polymer. The obtained polymer was analyzed by GPC. The weight average molecular weight in terms of standard polystyrene was 9,900. The resulting polymer is presumed to have a structural unit of the following formula (4-a) and a structural unit of the following formula (8).

(4-a)

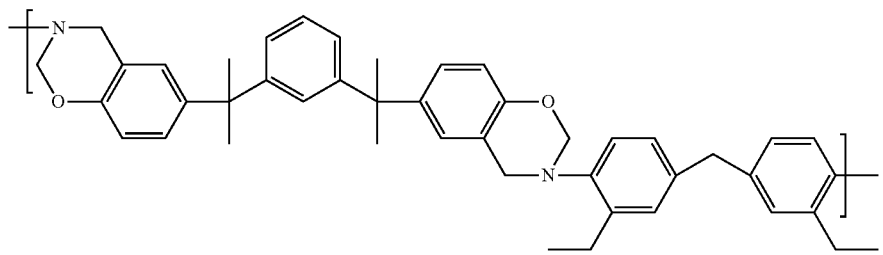

(8)

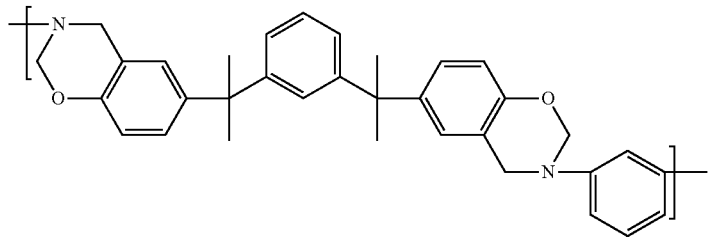

Synthesis Example 4

1.95 g of 1,3-phenylenediamine (available from Tokyo Chemical Industry Co., Ltd.), 41.20 g of 4,4'-diamino-3,3', 5,5'-tetramethyl diphenylmethane (KAYABOND 200S available from NIPPON KAYAKU Co., Ltd.), 69.34 g of bisphenol M (available from MITSUI FINE CHEMICALS, Inc.), 22.82 g of paraformaldehyde (available from Tokyo Chemical Industry Co., Ltd.), and 4.09 g of triethylamine were dissolved in 320.75 g of N-methyl-2-pyrrolidone. Purging with nitrogen was carried out, and a reaction was caused at 90° C. for 20 hours to obtain a solution containing a polymer. After that, the resultant solution was added dropwise to methanol, resulting in reprecipitation. The resultant precipitate was then collected by filtration with suction on a Buchner funnel, and washed with methanol twice. The resulting powder was dried for 12 hours with a reduced-pressure dryer to obtain a polymer. The obtained polymer was analyzed by GPC. The weight average molecular weight in terms of standard polystyrene was 7,700. The resulting polymer is presumed to have a structural unit of the following formula (4-b) and a structural unit of the following formula (8).

(4-b)

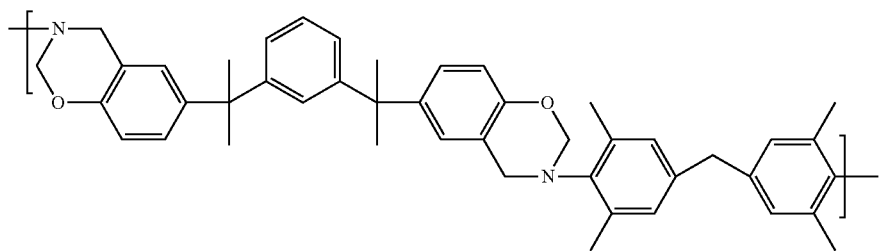

(8)

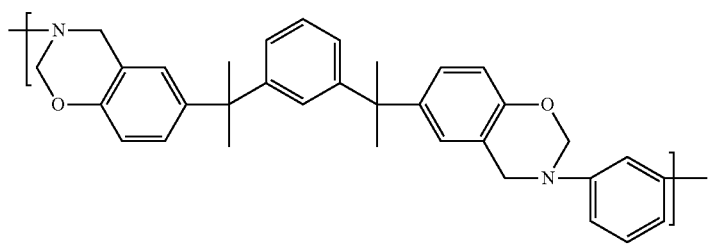

Comparative Example 1

1-Cyanoethyl-2-undecylimidazole (available from Tokyo Chemical Industry Co., Ltd.) as an epoxy resin curing agent was prepared.

Comparative Example 2

2-Ethyl-4-methylimidazole (available from Tokyo Chemical Industry Co., Ltd.) as an epoxy resin curing agent was prepared.

Comparative Example 3

4-Methyl-2-phenylimidazole (available from Tokyo Chemical Industry Co., Ltd.) as an epoxy resin curing agent was prepared.

[Evaluation of Heat Resistance]

The heat resistance of the polymers obtained in Synthesis Examples 1 and 2 and the imidazole-based epoxy resin curing agents prepared in Comparative Examples 1 to 3 was evaluated from measurement results of temperature (hereinafter abbreviated as 5% by mass-weight decrease temperature in the specification) at which the weight of 5% by mass decreases by heating a sample at 10° C./min by TG-DTA (TG/DTA2010SR manufactured by NETZSCH). The measurement results of 5% by mass-weight decrease temperature are shown in Table 1 below.

TABLE 1

|  | 5% by mass-weight decrease temperature (° C.) |
|---|---|
| Synthesis Example 1 | 391 |
| Synthesis Example 2 | 392 |
| Comparative Example 1 | 231 |
| Comparative Example 2 | 112 |
| Comparative Example 3 | 207 |

All the polymers obtained in Synthesis Examples 1 and 2 have a 5% by mass-weight decrease temperature of 380° C. or higher, and exhibit higher heat resistance as compared with the imidazole-based epoxy resin curing agents prepared in Comparative Examples 1 to 3.

Preparation of Thermosetting Resin Composition

Example 1

10 g of the polymer obtained in Synthesis Example 1 was dissolved in 40 g of tetrahydrofuran, and the mixture was filtered through a microfilter with a pore diameter of 0.2 μm made of polytetrafluoroethylene (hereinafter abbreviated as PTFE in the specification) to prepare a composition containing 20% by mass of solid content.

Example 2

7 g of the polymer obtained in Synthesis Example 1 and 3 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Example 3

5 g of the polymer obtained in Synthesis Example 1 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Example 4

10 g of the polymer obtained in Synthesis Example 2 was dissolved in 40 g of tetrahydrofuran, and the mixture was filtered through a microfilter with a pore diameter of 0.2 μm made of PTFE to prepare a composition containing 20% by mass of solid content.

Example 5

7 g of the polymer obtained in Synthesis Example 2 and 3 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Example 6

5 g of the polymer obtained in Synthesis Example 2 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Example 7

50 g of the polymer obtained in Synthesis Example 1 was dissolved in 50 g of cyclopentanone, and the mixture was filtered through a microfilter with a pore diameter of 5.0 μm made of PTFE to prepare a composition containing 50% by mass of solid content.

Example 8

35 g of the polymer obtained in Synthesis Example 1 and 15 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Example 9

25 g of the polymer obtained in Synthesis Example 1 and 25 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Example 10

50 g of the polymer obtained in Synthesis Example 2 was dissolved in 50 g of cyclopentanone, and the mixture was filtered through a microfilter with a pore diameter of 5.0 μm made of PTFE to prepare a composition containing 50% by mass of solid content.

Example 11

35 g of the polymer obtained in Synthesis Example 2 and 15 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Example 12

25 g of the polymer obtained in Synthesis Example 2 and 25 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Example 13

5 g of the polymer obtained in Synthesis Example 1, 5 g of EPOLEAD GT401 (available from DAICEL CORPORATION) as an epoxy resin, and 2 g of 3-phenylaminopropyltrimethoxy silane (available from Tokyo Chemical Industry Co., Ltd.) were dissolved in 65.5 g of tetrahydrofuran, and the mixture was mixed with 32.5 g of organosilica sol [dispersion solution of silica surface-treated with 3-methacryloxypropyltrimethoxysilane in methyl ethyl ketone, primary particle diameter of silica: 40 nm to 50 nm, solid content: 30.8% by mass, specific gravity (20° C.): 1.007, viscosity (20° C.): 2.5 mPa·s, moisture content: 0.08% by mass] as inorganic fillers, to prepare a composition containing 20% by mass of solid content.

Example 14

5 g of the polymer obtained in Synthesis Example 1, 5 g of EPOLEAD GT401 (available from DAICEL CORPORATION) as an epoxy resin, and 2 g of 3-phenylaminopropyltrimethoxy silane (available from Tokyo Chemical Industry Co., Ltd.) were dissolved in 22 g of cyclopentanone, and the mixture was mixed with 32.5 g of organosilica sol [dispersion solution of silica surface-treated with 3-methacryloxypropyltrimethoxysilane in methyl ethyl ketone, primary particle diameter of silica: 40 nm to 50 nm, solid content: 30.8% by mass, specific gravity (20° C.): 1.007, viscosity (20° C.): 2.5 mPa·s, moisture content: 0.08% by mass] as inorganic fillers. The mixture was concentrated with an evaporator to prepare a composition containing 50% by mass of solid content.

Comparative Example 4

7 g of the polymer obtained in Synthesis Example 3 and 3 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Comparative Example 5

5 g of the polymer obtained in Synthesis Example 3 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Comparative Example 6

7 g of the polymer obtained in Synthesis Example 4 and 3 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Comparative Example 7

5 g of the polymer obtained in Synthesis Example 4 and 5 g of EPOLEAD GT401 (available from DAICEL CORPORATION) as an epoxy resin were dissolved in 40 g of tetrahydrofuran, and the mixture was filtered through a microfilter with a pore diameter of 0.2 μm made of PTFE to prepare a composition containing 20% by mass of solid content.

Comparative Example 8

35 g of the polymer obtained in Synthesis Example 3 and 15 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Comparative Example 9

25 g of the polymer obtained in Synthesis Example 3 and 25 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Comparative Example 10

35 g of the polymer obtained in Synthesis Example 4 and 15 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Comparative Example 11

25 g of the polymer obtained in Synthesis Example 4 and 25 g of EPOLEAD GT401 (available from DAICEL CORPORATION) as an epoxy resin were dissolved in 50 g of cyclopentanone, and the mixture was filtered through a microfilter with a pore diameter of 5.0 μm made of PTFE to prepare a composition containing 50% by mass of solid content.

Comparative Example 12

25 g of the polymer obtained in Synthesis Example 3, 0.5 g of 1-cyanoethyl-2-undecylimidazole in Comparative Example 1, and 25.5 g of EPOLEAD GT401 (available from DAICEL CORPORATION) as an epoxy resin were dissolved in 51.0 g of cyclopentanone, and the mixture was filtered through a microfilter with a pore diameter of 5.0 μm made of PTFE to prepare a composition containing 50% by mass of solid content.

Comparative Example 13

25 g of the polymer obtained in Synthesis Example 4, 0.5 g of 1-cyanoethyl-2-undecylimidazole in Comparative Example 1, and 25.5 g of EPOLEAD GT401 (available from DAICEL CORPORATION) as an epoxy resin were dissolved in 51.0 g of cyclopentanone, and the mixture was filtered through a microfilter with a pore diameter of 5.0 μm made of PTFE to prepare a composition containing 50% by mass of solid content.

[Evaluation of Curing Characteristics]

1 g of each of the compositions prepared in Examples 1 to 6, and 13, and Comparative Examples 4 to 7 was placed in a metal cup with a diameter of 40 mm, baked at 50° C. for 60 minutes, at 65° C. for 60 minutes, and at 80° C. for 30 minutes, and the solvent was evaporated to form a thermosetting resin film. After that, the curing temperature of the resin film was evaluated by increasing the temperature at 5° C./min in a rheometer (MCR102 manufactured by Anton Paar GmbH). A curing temperature of lower than 190° C. is judged as 0, and a curing temperature of 190° C. or higher is judged as X. The curing temperature shown herein is a temperature at which the complex viscosity is 10,000 Pa·s by a curing reaction of the resin film. The results of the curing temperature are shown in Table 2.

TABLE 2

| | Curing Characteristics |
|---|---|
| Example 1 | ○ |
| Example 2 | ○ |
| Example 3 | ○ |
| Example 4 | ○ |
| Example 5 | ○ |
| Example 6 | ○ |
| Example 13 | ○ |
| Comparative Example 4 | X |
| Comparative Example 5 | X |
| Comparative Example 6 | X |
| Comparative Example 7 | X |

In the resin films formed from the compositions prepared in Examples 1 to 6, and 13, the curing temperature is lower than those in the resin film formed from the compositions prepared in Comparative Examples 4 to 7. This shows that the thermosetting resin composition of the present invention promotes an epoxy curing reaction.

[Evaluation of Adhesion]

A silicon wafer of 4 inches was spin-coated with each of the compositions prepared in Examples 7 to 12, and 14, and Comparative Examples 12 and 13 so that the thickness after baking was 15 μm to 25 μm, baked at 100° C. for 5 minutes, and at 150° C. for 5 minutes, and the solvent was evaporated to form a thermosetting resin film. The silicon wafer having the resin film was adhered to a glass wafer of 4 inches using a bonding device (VJ-300 manufactured by Ayumi Industries Company Limited) under conditions of a degree of vacuum of 10 Pa or less, a temperature of 140° C., and an applied load of 300 kg. The silicon wafer was then heated at 180° C. for 60 minutes so that the resin was cured. Good adhesion without voids is evaluated as ○, and adhesion failure with voids is evaluated as X. The results are shown in Table 3.

[Heat Resistance after Adhesion]

A sample which exhibited good adhesion in the evaluation of adhesion was heated at 200° C. for 5 minutes, and placed on a hot plate of 250° C. The presence or absence of peeling was confirmed. The absence of peeling even after 1 hour or more elapsed from placing of the sample on the hot plate is evaluated as ○, and the occurrence of peeling within less than 1 hour is evaluated as X. The results are shown in Table 3.

TABLE 3

| | Adhesion | Heat Resistance after Adhesion |
|---|---|---|
| Example 7 | ○ | ○ |
| Example 8 | ○ | ○ |
| Example 9 | ○ | ○ |
| Example 10 | ○ | ○ |
| Example 11 | ○ | ○ |
| Example 12 | ○ | ○ |
| Example 14 | ○ | ○ |
| Comparative Example 12 | X | — |
| Comparative Example 13 | X | — |

The compositions prepared in Examples 7 to 12, and 14 have good adhesion and heat resistance after adhesion. On the other hand, the compositions prepared in Comparative Examples 12 and 13 using 1-cyanoethyl-2-undecylimidazole as an existing epoxy resin curing agent have low heat resistance, and voids occur, which are considered to be caused by sublimation.

[Evaluation of Physical Properties of Cured Film]

A silicon wafer in which aluminum foils were laminated was spin-coated with each of the compositions prepared in Examples 8, 9, 11, 12, and 14 and Comparative Examples 8 to 13 so that the thickness after baking was 15 μm to 25 μm, baked at 100° C. for 5 minutes, and at 150° C. for 5 minutes, and the solvent was evaporated to form a thermosetting resin film in which the aluminum foils were layered. The thermosetting resin film was then baked at 180° C. for 60 minutes in a nitrogen atmosphere, to cure the resin film. The resin film was added in an aqueous solution of 6 mol/L hydrochloric acid, and the aluminum foils were dissolved to obtain the cured film. The resultant was cut into a width of 5 mm. The elongation of the cured film was measured when the temperature was increased at 5° C./min from room temperature to 200° C. by TMA (TMA4000SA manufactured by NETZSCH). Thus, Tg, and the linear expansion coefficients (CTEs) at temperature lower than Tg, and at temperature higher than Tg were evaluated. Tg of 140° C. or higher is judged as ○, and Tg of lower than 140° C. is judged as X. CTE at a temperature lower than Tg of less than 70 ppm/° C. is judged as ○, and CTE of 70 ppm/° C. or more is judged as X. CTE at a temperature higher than Tg of less than 1,000 ppm/° C. is judged as ○, and CTE of 1,000 ppm/° C. or more is judged as X. Herein, Tg is a temperature at which the elongation amount of the cured resin is inflected. The measurement results are shown in Table 4 below.

TABLE 4

|  | Tg | CTE at temperature lower than Tg | CTE at temperature higher than Tg |
|---|---|---|---|
| Example 8 | ○ | ○ | ○ |
| Example 9 | ○ | ○ | ○ |
| Example 11 | ○ | ○ | ○ |
| Example 12 | ○ | ○ | ○ |
| Example 14 | ○ | ○ | ○ |
| Comparative Example 8 | X | ○ | X |
| Comparative Example 9 | X | X | X |
| Comparative Example 10 | X | ○ | X |
| Comparative Example 11 | X | X | X |
| Comparative Example 12 | X | ○ | ○ |
| Comparative Example 13 | X | ○ | ○ |

For the cured films obtained from the compositions prepared in Examples 8, 9, 11, 12, and 14, cross-linking of an epoxy resin sufficiently proceeds, and good characteristics of cured resin are obtained. In contrast, for the cured films obtained from the compositions prepared in Comparative Examples 8 to 13, failure of characteristics is caused because of insufficient cross-linking of the epoxy resin.

[Evaluation of Electrical Characteristics]

Each of the compositions prepared in Examples 7 to 12 was diluted by addition of cyclopentanone. The mixture was applied to a silicon wafer using a spin coater, and the wafer was placed on a hot plate and baked at 100° C. for 2 minutes and at 130° C. for 2 minutes, and then baked at 180° C. for 60 minutes in an oven purged with nitrogen to form the cured film with a thickness of 500 nm. A leak current value and a dielectric constant at which an electric field of 1 MV/cm was applied to the prepared sample with a Cvmap 92B (manufactured by Four Dimensions) were measured. The results are shown in Table 5.

TABLE 5

|  | Dielectric Constant | Leak Current Value (A/cm$^2$) |
|---|---|---|
| Example 7 | 3.0 | $0.5 \times 10^{-9}$ |
| Example 8 | 3.2 | $1.3 \times 10^{-9}$ |
| Example 9 | 3.4 | $1.9 \times 10^{-9}$ |
| Example 10 | 3.0 | $0.6 \times 10^{-9}$ |
| Example 11 | 3.3 | $1.9 \times 10^{-9}$ |
| Example 12 | 3.5 | $3.8 \times 10^{-9}$ |

The cured films obtained from the compositions prepared in Examples 7 to 12 have good electrical characteristics for an adhesive or an underfill application.

The invention claimed is:

1. A thermosetting resin composition comprising a polymer having at least one structural unit of the following Formula (1):

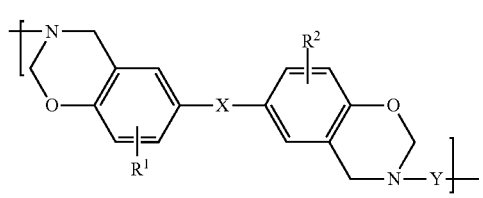

(1)

{wherein each of $R^1$ and $R^2$ is independently a hydrogen atom or a $C_{1-4}$ alkyl group, X is a single bond or a divalent organic group, and Y is an arylene group of the following Formula (2):

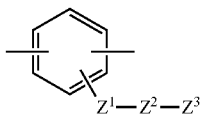

(2)

(wherein $Z^1$ is a carbonyl group or a —CONH— group, $Z^2$ is a $C_{1-5}$ alkylene group or a 5- or 6-membered divalent saturated heterocyclic group containing at least one nitrogen atom, and $Z^3$ is a 5- or 6-membered aromatic heterocyclic group containing two nitrogen atoms in which at least one of hydrogen atoms may be substituted by a $C_{1-5}$ alkyl group)}.

2. The thermosetting resin composition according to claim 1, wherein $Z^3$ in Formula (2) is an imidazoryl group.

3. The thermosetting resin composition according to claim 1, wherein $Z^2$ in Formula (2) is a $C_{1-5}$ alkylene group.

4. The thermosetting resin composition according to claim 1, wherein $Z^1$ in Formula (2) is a —CONH— group.

5. The thermosetting resin composition according to claim 1, wherein X in Formula (1) is a divalent organic group containing a $C_{1-6}$ alkylene group in which at least one of hydrogen atoms may be substituted by a halogen atom, a cyclic alkylene group, an arylene group in which at least one of hydrogen atoms may be substituted by a halogen atom, a sulfonyl group, a carbonyl group, a —O— group, or a —COO— group.

6. The thermosetting resin composition according to claim 1, wherein X in Formula (1) is a divalent organic group of the following Formula (3):

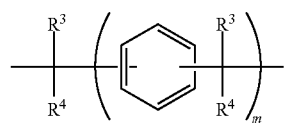

(3)

(wherein each of $R^3$ and $R^4$ is independently a hydrogen atom or a methyl group in which at least one of hydrogen atoms may be substituted by a halogen atom, and m is 0 or 1).

7. The thermosetting resin composition according to claim 6, wherein the divalent organic group of Formula (3) is the following Formula (3-a) or (3-b):

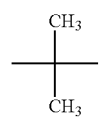

(3-a)

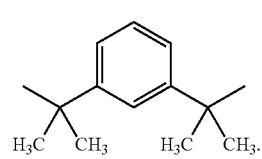

(3-b)

8. The thermosetting resin composition according to claim 1, wherein the polymer further has a structural unit of Formula (4):

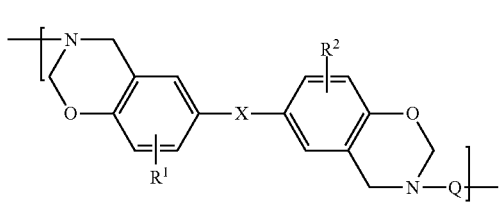
(4)

{wherein R¹, R², and X are the same as the definitions according to claim 1, and Q is a divalent organic group of the following Formula (5) or (6):

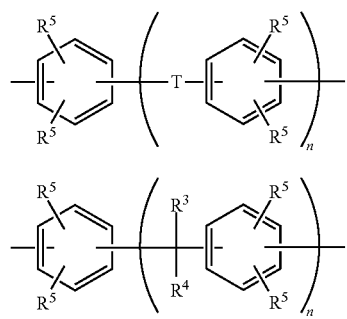
(5)
(6)

(wherein T is a single bond, a sulfonyl group, or a —O— group, each of R³ and R⁴ is independently a hydrogen atom or a methyl group in which at least one of hydrogen atoms may be substituted by a halogen atom, four R⁵ are each independently a hydrogen atom, a methyl group, an ethyl group, or a methoxy group, and n is 0 or 1)}.

9. The thermosetting resin composition according to claim 8, wherein the divalent organic group of Formula (5) or (6) is the following Formula (5-a), (6-a), (6-b) or (6-c):

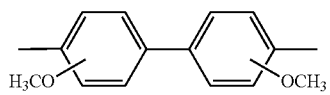
(5-a)

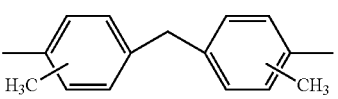
(6-a)

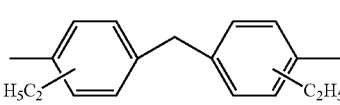
(6-b)

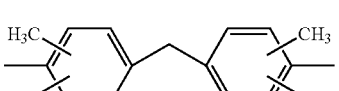
(6-c)

10. The thermosetting resin composition according to claim 1, wherein the polymer has a weight average molecular weight of 1,000 to 100,000.

11. The thermosetting resin composition according to claim 1, further comprising an epoxy resin.

12. The thermosetting resin composition according to claim 1, further comprising a solvent.

13. The thermosetting resin composition according to claim 1, which is an adhesive composition or an underfill composition.

14. The thermosetting resin composition according to claim 1, further comprising a silane coupling agent.

15. The thermosetting resin composition according to claim 1, further comprising inorganic fillers with a particle diameter of 1 nm or more and 700 nm or less.

* * * * *